(12) United States Patent
Lin et al.

(10) Patent No.: US 9,525,104 B2
(45) Date of Patent: Dec. 20, 2016

(54) LIGHT-EMITTING DIODE

(71) Applicant: EPISTAR CORPORATION, Hsinchu (TW)

(72) Inventors: Yu-Yao Lin, Hsinchu (TW); Tsun-Kai Ko, Hsinchu (TW); Chien-Yuan Tseng, Hsinchu (TW); Yen-Chih Chen, Hsinchu (TW); Chun-Ta Yu, Hsinchu (TW); Shih-Chun Ling, Hsinchu (TW); Cheng-Hsiung Yen, Hsinchu (TW); Hsin-Hsien Wu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 172 days.

(21) Appl. No.: 14/162,590

(22) Filed: Jan. 23, 2014

(65) Prior Publication Data

US 2014/0217358 A1     Aug. 7, 2014

(30) Foreign Application Priority Data

Feb. 4, 2013   (TW) .............................. 102104451 A

(51) Int. Cl.
| | |
|---|---|
| *H01L 29/06* | (2006.01) |
| *H01L 31/00* | (2006.01) |
| *H01L 33/32* | (2010.01) |
| *H01L 33/14* | (2010.01) |
| *H01L 33/22* | (2010.01) |

(52) U.S. Cl.
CPC .............. *H01L 33/32* (2013.01); *H01L 33/14* (2013.01); *H01L 33/22* (2013.01)

(58) Field of Classification Search
CPC ........ H01L 33/22; H01L 33/32; H01L 33/007; H01L 33/0079; H01L 33/105; H01L 29/045

See application file for complete search history.

(56) References Cited

U.S. PATENT DOCUMENTS

| | | | | |
|---|---|---|---|---|
| 7,420,221 | B2 * | 9/2008 | Nagai ..................... | H01L 33/22 257/100 |
| 2003/0132445 | A1 * | 7/2003 | Yoshitake ............. | H01L 33/105 257/84 |
| 2005/0184305 | A1 * | 8/2005 | Ueda ...................... | H01L 33/08 257/99 |
| 2006/0043396 | A1 * | 3/2006 | Tsuda .................... | H01L 29/045 257/94 |
| 2007/0205407 | A1 * | 9/2007 | Matsuo ................. | H01L 29/045 257/13 |
| 2010/0200884 | A1 * | 8/2010 | Lee ....................... | H01L 33/0079 257/98 |
| 2010/0213493 | A1 * | 8/2010 | Hsu ....................... | H01L 33/22 257/98 |

* cited by examiner

*Primary Examiner* — Zandra Smith
*Assistant Examiner* — John M Parker
(74) *Attorney, Agent, or Firm* — Muncy, Geissler, Olds & Lowe, P.C.

(57) ABSTRACT

This application discloses a light-emitting diode comprising a first semiconductor layer, an active layer on the first semiconductor layer, a second semiconductor layer on the active layer, and a semiconductor contact layer on the second semiconductor layer. The second semiconductor layer comprises a first sub-layer and a second sub-layer formed above the first sub-layer, wherein the material of the second sub-layer comprises $Al_xGa_{1-x}N$ (0<x<1) and the second sub-layer has a surface comprising a structure of irregularly distributed holes.

18 Claims, 4 Drawing Sheets

LIGHT-EMITTING DIODE

BACKGROUND

Related Application

This application claims priority from previously filed Taiwan Patent Application No. 102104451 filed on Feb. 4, 2013, entitled as "LIGHT-EMITTING DIODE AND THE MANUFACTURE METHOD OF THE SAME", and the entire contents of which are hereby incorporated by reference herein in its entirety.

Technical Field

The present disclosure relates to a light-emitting diode and the manufacture method of the same, and in particular to improve opto-electrical characteristics of a light-emitting diode.

DESCRIPTION OF THE RELATED ART

The light-emitting diodes (LEDs) of the solid-state lighting elements have the characteristics of the low power consumption, low heat generation, long operational life, shockproof, small volume, quick response and good opto-electrical property like light emission with a stable wavelength, so the LEDs have been widely used in various lighting application. When a light-emitting diode is turned on, the current passing through the light-emitting diode is called forward operating current ($I_f$) and the voltage cross the light-emitting diode measured under the forward operating current is called forward voltage ($V_f$).

The advantage of the light-emitting diode is low power consumption, but it is more important to have sufficient light in daily life. In addition to increase the amount of light-emitting diodes, the operating current can also be increased to enhance the luminance intensity of each light-emitting diode. However, the increase of operating current of a light-emitting diode also increases the product of the forward operating current and forward voltage which increases the power that is turned to heat. In order to drive a light-emitting diode under low power consumption and keep the light-emitting diode maintained at sufficient luminance intensity, many efforts have been devoted to lowering the forward voltage of the light-emitting diode to prevent the product of the forward voltage and the forward current from being too large and avoid excess energy becoming heat.

The light-emitting diodes can be further combined with a sub-mount to form a light emitting device. The light-emitting device comprises a sub-mount with circuit; a solder on the sub-mount fixing the light-emitting diode on the sub-mount and electrically connecting the base of the light-emitting diode and the circuit of the sub-mount; and an electrical connection structure electrically connecting the electrode pad of the light-emitting diode and the circuit of the sub-mount; wherein the above sub-mount can be a lead frame or a large size mounting substrate in convenience of designing circuit of the light-emitting device and improving its heat dissipation.

SUMMARY OF THE DISCLOSURE

The present application discloses a light emitting device comprising a first semiconductor layer, an active layer on the first semiconductor layer, a second semiconductor layer on the active layer, and a semiconductor contact layer on the second semiconductor layer. The second semiconductor layer comprises a first sub-layer and a second sub-layer on the first sub-layer, wherein the second sub-layer comprises $Al_xGa_{1-x}N$ (0<x<1) and the second sub-layer comprises a plurality of irregularly distributed holes on a surface of the second sub-layer.

The present application discloses a method of manufacturing a light emitting device, comprising providing a substrate, forming a first semiconductor layer on the substrate, forming an active layer on the first semiconductor layer, and epitaxially forming a second semiconductor layer comprising $Al_xGa_{1-x}N$ (0<x<1) on the active layer. The second semiconductor layer comprises a surface and a structure of irregularly distributed holes located on the surface.

DETAILED DESCRIPTION OF THE EMBODIMENTS

The drawings illustrate the embodiments of the application and, together with the description, serve to illustrate the principles of the application. The same name or the same reference number given or appeared in different paragraphs or figures along the specification should has the same or equivalent meanings while it is once defined anywhere of the disclosure. The thickness or the shape of an element in the specification can be expanded or narrowed. It is noted that the elements not drawn or described in the figure can be included in the present application by the skilled person in the art.

Figure 1:
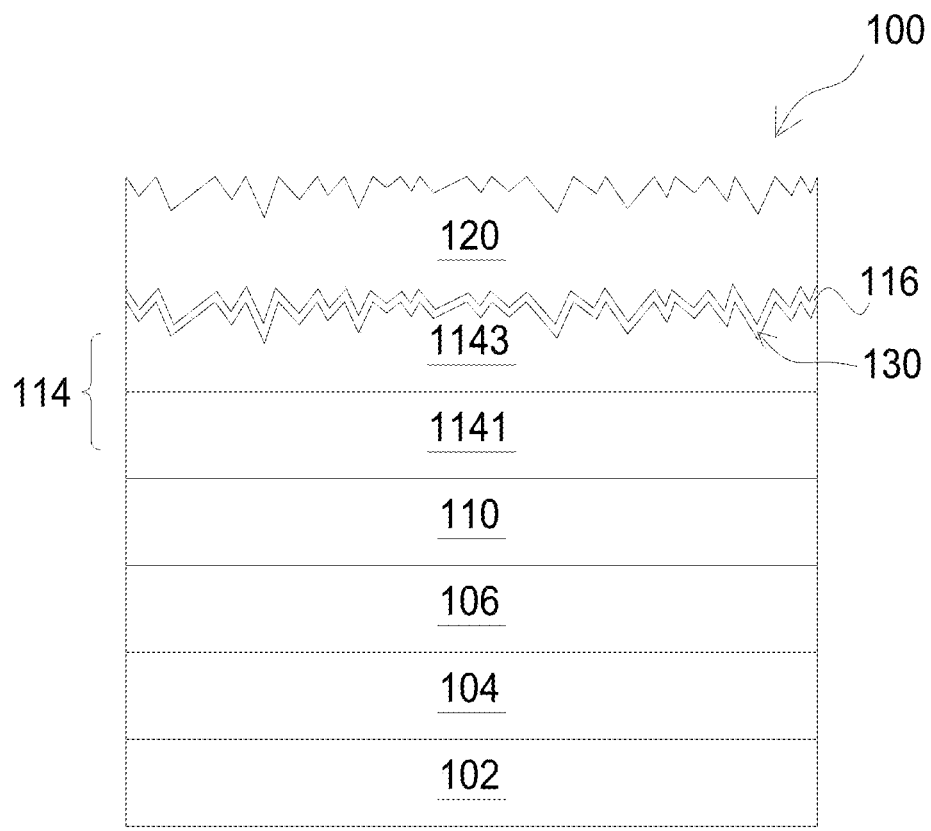
FIG. 1 shows an embodiment of a first light-emitting stack in accordance with an embodiment of the present disclosure.

FIG. 1 shows a cross-sectional view of the first light-emitting stack 100 in accordance with the first embodiment of this application. The first light-emitting stack comprises a substrate 102, a super-lattice layer 104, a first semiconductor layer 106, an active layer 110, a second semiconductor layer 114, a semiconductor contact layer 116 and a transparent conductive oxide layer 120. The material of the substrate 102 comprises one or more elements such as Ga, As, Si, C, P, Al, N, I, Zn, O, Li but is not limited to the elements listed. The substrate 102 can be a conductive substrate, an insulating substrate or a composite substrate. The conductive substrate can be a metal substrate, such as substrate comprising Al or Si; the insulating substrate can be a sapphire substrate or a ceramic substrate which is insulative and thermally conductive. The composite substrate can be composed of conducting material and insulating material to change current distribution in order to solve the issue of current crowding or improve the light reflectivity to reduce the amount of internal absorption. Besides, the substrate 102 can also be a patterned substrate having a pattern on its surface. The super-lattice layer 104 is formed between the substrate 102 and the first semiconductor layer 106. The super-lattice layer 104 is provided to decrease the strength arisen from the lattice mismatch between the substrate 102 and the first semiconductor layer 106 which prevents the epitaxy structure from being damaged by the strength or unstable. In another embodiment, an adhesive layer (not shown in the figure) for connecting layers is formed between the substrate 102 and the first semiconductor layer 106 to enhance the bonding between the substrate 102 and the first semiconductor layer 106. When the first semiconductor layer 106 is a p-type semiconductor layer, the second semiconductor layer 114 is an n-type semiconductor layer which is opposite to the first semiconductor layer 106. On the contrary, the second semiconductor layer 114 is an n-type semiconductor layer while the first semiconductor layer 106 is a p-type semiconductor layer. The first semiconductor layer 106 and the second semiconductor layer 114 can be cladding layers. The active layer 110 formed between the first semiconductor layer 106 and the second semiconductor layer 114 can be a single layer structure or a multi-quantum well structure comprising well layers and barrier layers to emit a light with specific wavelength. In this embodiment, the active layer 110 emits a blue light with a main wavelength between 440~470 nm which is an incoherent light.

Figure 5A:
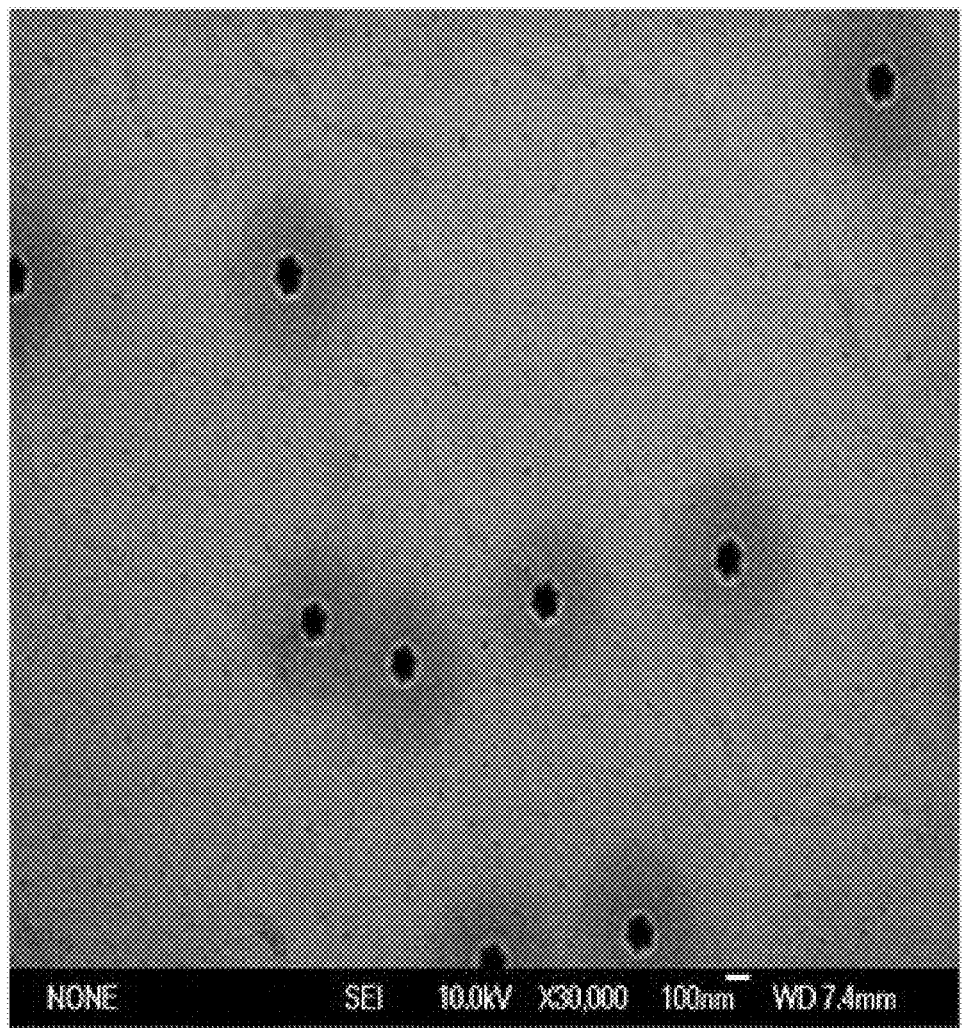
FIG. 5A shows a top view SEM image of the hexagonal cavities in accordance with an embodiment of the present disclosure.
Figure 5B:
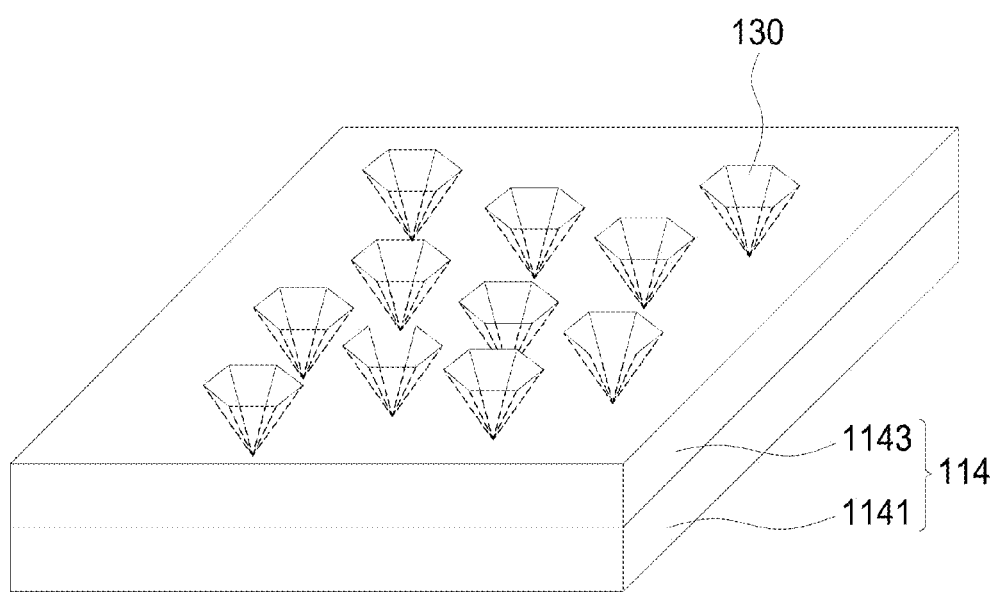
FIG. 5B shows a perspective view of the hexagonal cavities in accordance with an embodiment of the present disclosure.

The second semiconductor layer 114 comprises a first sub-layer 1141 and a second sub-layer 1143 on the first sub-layer 1141. A semiconductor contact layer 116 is formed on the second sub-layer 1143. The second semiconductor layer 114 comprises materials of groups III-V and the material of the second sub-layer 1143 is $Al_xGa_{1-x}N$ (0<x<1). As shown in FIG. 1, the surface between the second sub-layer 1143 and the semiconductor contact layer 116 is an irregularly surface which comprising irregularly distributed holes formed above. The irregularly surface and the irregularly distributed holes are formed while epitaxially forming the second sub-layer 1143 consisted of $Al_xGa_{1-x}N$, and the holes are irregularly distributed with different depths on the irregularly surface. FIG. 5A shows a top view SEM image of the hexagonal cavities 130 in the second sub-layer 1143 of the second semiconductor layer 114. FIG. 5B shows a perspective view of the hexagonal cavities 130 in the second sub-layer 1143 of the second semiconductor layer 114. As shown in FIGS. 5A-5B, in this embodiment, the holes formed while epitaxially forming $Al_xGa_{1-x}N$ not only locate on the surface but also comprises hexagonal cavities 130 extending downward, and at least one of the hexagonal cavities 130 extends to inner of the second semiconductor layer 114 which is a cladding layer.

A transparent conductive oxide layer 120 is formed on the semiconductor contact layer 116 and an electrode layer (not shown in the figure) is then formed on the transparent conductive oxide layer 120. The material of the transparent conductive oxide layer 120 can be ITO. The material of the semiconductor contact layer 116 comprises materials having an energy band lower than that of the second semiconductor layer 114, such as AlGaN or InGaN, with carriers heavily doped to decrease the energy bandgap of the semiconductor contact layer 116 and form an Ohmic contact between the transparent conductive oxide layer 120 and the second semiconductor layer 114.

In this embodiment, the first semiconductor layer 106 has a first lattice constant, the active layer 110 on the first semiconductor layer 106 has a second lattice constant, and the second semiconductor layer 114 on the active layer has a third lattice constant. Since the second lattice constant is larger than the first lattice constant, the active layer 110 suffers an outward stress from the first semiconductor layer 106 and the quality of the epitaxy layer is poor. In order to improve the stress the active layer 110 encounters, different materials are chosen to form the second semiconductor layer 114. Then, the second semiconductor layer 114 has a third lattice constant smaller than the first lattice constant to form an inward stress and achieves a balance of strength to improve quality of epitaxy layers. In other words, the first semiconductor layer 106 has a first lattice constant between a second lattice constant of the active layer 110 and a third lattice constant of the second semiconductor layer 114 to form epitaxy layers in order to decrease the forward voltage ($V_f$) while operating the light-emitting stack 100.

Figure 2:
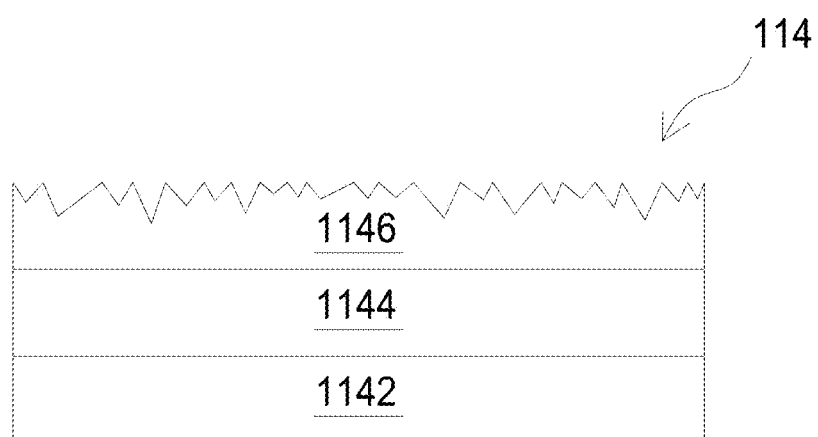
FIG. 2 shows an embodiment of a second semiconductor layer in accordance with an embodiment of the present disclosure.

In this embodiment, the second semiconductor layer 114 on the active layer 110 comprises sub-layers with different concentrations of impurities and same conductivity as shown in FIG. 2. Among the sub-layers, the first sub-layer 1142 is most adjacent to the active layer 110, the second sub-layer 1146 is arranged on the first sub-layer 1142 and the third sub-layer 1144 is arranged between the first sub-layer 1142 and the second sub-layer 1146. The second sub-layer 1146 is most adjacent to the semiconductor contact layer 116, and an outer surface of the second sub-layer 1146 most adjacent to the semiconductor contact layer 116 comprises irregularly distributed holes. The first sub-layer 1142 and the second sub-layer 1146 comprise aluminum, wherein the first sub-layer 1142 and the second sub-layer 1146 comprise $Al_yGa_{1-y}N$ (0<y<0.3). In another embodiment, because the second semiconductor layer 114 and its adjacent active layer 110 and semiconductor contact layer 116 have different lattice constants, for example, if the lattice constants of the active layer 110 and the semiconductor contact layer 116 are larger, a smaller value of y of the $Al_yGa_{1-y}N$, for example, between 0~0.1 is chosen so that the lattice constants of the first sub-layer 1142 and the second sub-layer 1146 are larger and the stress between two stacked layers is reduced. These sub-layers have same conductivity with different concentration of impurities, wherein a third concentration of the third sub-layer 1144 is between a first concentration of the first sub-layer 1142 and a second concentration of the second sub-layer 1146. In this embodiment, the first concentration is about $5*10^{18}$ cm$^3$, the third concentration is about $3*10^{19}$ cm$^3$, and the second concentration is about $1*10^{20}$ cm$^3$. Besides, thicknesses of the three sub-layers are different; the thickness of the third sub-layer 1144 is larger than that of the first sub-layer 1142 and that of the second sub-layer 1146. In another embodiment, the material of the third sub-layer 1144 does not comprise aluminum but the materials of the first sub-layer 1142 and the second sub-layer 1146 comprise aluminum.

Figure 3:
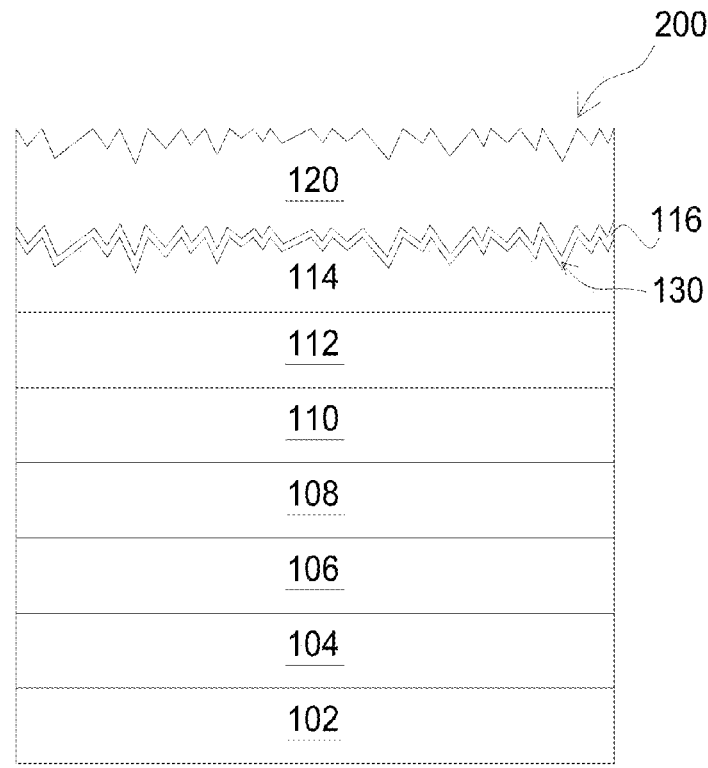
FIG. 3 shows an embodiment of a second light-emitting stack in accordance with an embodiment of the present disclosure.

As shown in FIG. 3, a second light-emitting stack 200 in accordance with another embodiment of the present disclosure comprises a substrate 102, a super-lattice layer 104, a first semiconductor layer 106, a modulation layer 108, an active layer 110, a second semiconductor layer 114, an electron blocking layer 112, a semiconductor contact layer 116 and a transparent conductive oxide layer 120. In this embodiment, the super-lattice layer 104 is adopted to decrease the stress arisen from mismatch of lattice constants between the second semiconductor layer 106 and the substrate 102 and further avoids deformation induced from the stress while forming semiconductor stacks. When the active layer 110 is a multi-quantum well structure, a barrier layer most adjacent to the second semiconductor layer 114 comprises InGaN, that is, the barrier layer most close to the first sub-layer 1142 comprises InGaN.

In this embodiment, a modulation layer 108 is formed on the first semiconductor layer 106 before forming the multi-quantum well structure. The material of the modulation layer 108 and the active layer 110 both comprise materials of group III-V, but the concentration of impurities of the modulation layer 108 is smaller than the active layer 110 to decrease the stress, which is induced from difference of lattice constants, between the multi-quantum well and the first semiconductor layer 106 so the quality of epitaxy layers is therefore improved. In this embodiment, the active layer 110 emits a blue light with a main wavelength between 440~470 nm and the blue light is an incoherent light. In this embodiment, materials of the first semiconductor layer 106, the active layer 110, the second semiconductor layer 114 and the modulation layer 108 comprise one or more group III-V elements such as Al, In, Ga, and N to form different stacked layers, for example, stacked layers comprising InGaN and GaN or stacked layers comprising AlGaN and InGaN are formed, so the differences of lattice constants are limited in a pre-determined range to decrease the stress between stacked layers. Though modulation layer 108 and the active layer 110 both comprise group III-V materials but the composition of the modulation layer 108 is different from that of the active layer 100. Then, the lattice constant of the modulation layer 108 is between the active layer 110 and the first semiconductor layer 106 in order to improve the quality of the epitaxy layers formed on the first semiconductor layer 106 and to enhance the light emitting efficiency.

In this embodiment, the first semiconductor layer 106 is an n-type semiconductor layer, and the second semiconductor layer 114 is a p-type semiconductor layer. An electron blocking layer 112 is formed between the active layer 110 and the second semiconductor layer 114 to prevent the electrons moving from the first semiconductor layer 106 to the active layer 110 from overflowing to the second semiconductor layer 114 and being recombined in the area beyond the active layer 110 that lowers the light emitting efficiency. To gain the above benefit, the impurity concentration of the electron blocking layer 112 is higher than that of the second semiconductor layer 114 or higher than a second impurity concentration of the second sub-layer 1146 within the second semiconductor layer 114. The electron blocking layer 112 comprises group III-V material, such as $Al_zGa_{1-z}N$ (0.15<Z<0.4), and the effect of blocking electrons can be enhanced by increasing the amount of aluminum.

As shown in FIG. 3, the second semiconductor layer 114 comprises a plurality of sub-layers. The sub-layers comprise AlGaN with different concentration of Al and have different lattice constants. The lattice constant of the second semiconductor layer 114 is between that of the electron blocking layer 112 and the active layer 110, and the lattice constant of the active layer 110 is larger than that of the electron blocking layer 112 and the second semiconductor layer 114. This arrangement prevent the active layer 110 from directly contacting the second semiconductor layer 114 which has a larger lattice constant difference, and the current blocking layer 112 can reduce the stress arisen from the large difference of lattice constants between the active layer 110 and the second semiconductor layer 114. The stress between the sub-layers within the second semiconductor layer 114 and the adjacent electron blocking layer 112 is not too large. Thus, the quality of epitaxy layers is improved and the forward voltage ($V_f$) of the second light-emitting stack 200 is improved.

Figure 4:
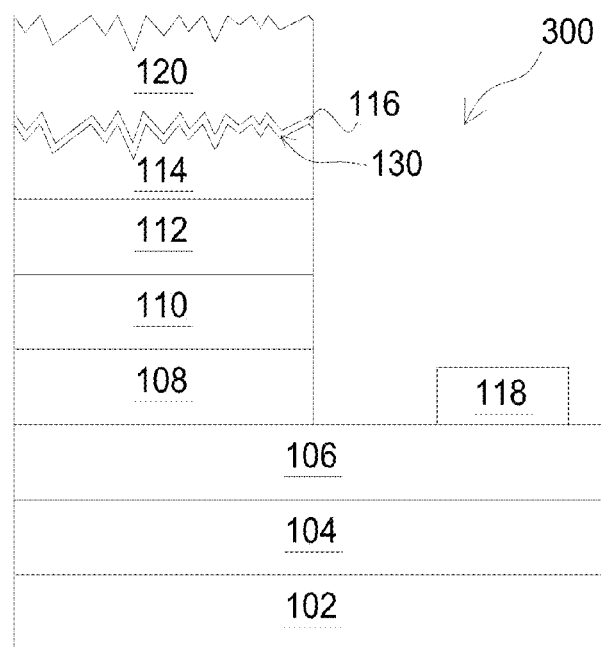
FIG. 4 shows an embodiment of a third light-emitting stack in accordance with an embodiment of the present disclosure.

FIG. 4 shows another embodiment in accordance with this application. Based on the cross sectional view of the third light-emitting stack 300, the third light-emitting stack 300 has a structure similar with the second light-emitting stack 200 shown in FIG. 3. But the substrate 102, the first semiconductor layer 106, and the super lattice constant layer 104 have larger area compared with other layers. Thus, other layers only cover a portion of the first semiconductor layer 106. In the third light-emitting stack 300, the semiconductor contact layer 118 is formed on the second semiconductor layer 114 and covers a portion of the first semiconductor layer 106. An electrode layer (not shown in the figure) can be further formed on the semiconductor contact layer 118.

In a process of manufacturing the light-emitting stack 100 in accordance with an embodiment of this application, a substrate 102 is provided first. Then, before forming the first semiconductor layer 106, a super-lattice layer 104 on the substrate 102 is formed. The material of the super-lattice layer 104 is chosen according to the difference of lattice constants. In other words, the material of the super-lattice layer 104 has a lattice constant between that of the first semiconductor layer 106 and that of the substrate 102. In this embodiment, the first semiconductor layer 106 and the super-lattice layer 104 comprise group III-V materials, and a super-lattice layer 104 is formed to suppress the stress between the substrate 102 and the first semiconductor layer 106. A first semiconductor layer 106 is formed on the super-lattice layer 104 and an active layer 110 is formed on the first semiconductor layer 106, wherein the active layer 110 can be a multi-quantum well structure. A second semiconductor layer 114 comprising $Al_xGa_{1-x}N$ (0<x<1) is then formed on the active layer 110, a semiconductor contact layer 116 is formed on the second semiconductor layer 114, and a transparent conductive oxide layer 120 is formed on the semiconductor contact layer 116. The portion of the second semiconductor layer 114 most close to the semiconductor contact layer 116 comprises $Al_xGa_{1-x}N$ (0<x<1). An irregular surface is located between the second semiconductor layer 114 and the semiconductor contact layer 116 and a structure of irregularly distributed holes are located on the surface. The structure of irregularly distributed holes is generated during the epitaxial formation of the second semiconductor layer 114 and the structure has hexagonal cavities 130. At least one of the hexagonal cavities 130 extends to the second semiconductor layer 114. A top view SEM image of the hexagonal cavities 130 in the second semiconductor layer 114 as shown in FIG. 4 is similar to the hexagonal cavities 130 in the second sub-layer 1143 of the second semiconductor layer 114 in FIG. 5A. In this embodiment, the active layer 110 emits a blue light with a major wavelength between 440~470 nm which is an incoherent light.

As shown in FIG. 2, the second semiconductor layer 114 comprises a first sub-layer 1142, a second sub-layer 1146, and a third sub-layer 1144. The step of forming the second semiconductor layer 114 comprises introducing a gas comprising Ga and N and an organometallic gas comprising Al to form AlGaN with a pre-determined flow rate. The process condition of introducing the organometallic gas comprising Al is introducing the organometallic gas with a pre-determined flow rate of 30~300 sccm under a condition of environment temperature between 900~1100° C. and a pressure between 300~500 torr. The organometallic gas can be $(CH_3)_3Al$ (TMAl) which comprises Al. As mentioned above, the concentrations of impurities of the first sub-layer 1142, the second sub-layer 1146, and the third sub-layer 1144 are different, so the concentration of the gas with impurities introduced for forming the second sub-layer 1146 is larger than that of the gas introduced for forming the first sub-layer 1142. The concentration of the gas with impurities introduced for forming the third sub-layer 1144 is raised such that the concentration of the impurities within the sub-layers is increased in a direction that is away from the active layer 110. In this embodiment, the second semiconductor layer 114 is a p-type semiconductor layer, and the magnesocene ($Mg(C_5H_5)_2$) is introduced in the formation of the second semiconductor layer 114 to provide Mg as the impurities added in the semiconductor layer.

A semiconductor contact layer 116 and the transparent conductive oxide layer 120 are then formed on the second semiconductor layer 114, wherein the material of the transparent conductive oxide layer 120 can be ITO and the transparent conductive oxide layer 120 is a window layer for increasing light extraction. An electrode layer (not shown in the figure) is then formed on the transparent conductive oxide layer 120. When the substrate 102 is made of a conductive material, an electrode layer (not shown in the figure) is formed on a side of the substrate, opposing to the side of forming the semiconductor stacks. In another embodiment, the substrate 102 is removed, a conductive substrate is attached to the super-lattice layer 104, and an electrode layer is formed on the other side of the conductive substrate.

The difference between the second light-emitting stack 200 in FIG. 3 and the first light-emitting stack 100 is a modulation layer 108 formed on the first semiconductor layer 106 before forming the active layer 110 in the second light-emitting stack 200. Thus, the epitaxial quality of the active layer 110 is improved owing to smaller difference of lattice constants between the active layer 110 and the modulation layer 108. Another difference is an electron blocking layer 112 formed between the step of forming the second semiconductor layer 114 and the step of forming the active layer 110, thus the electron blocking layer 112 is located between the active layer 110 and the second semiconductor layer 114 wherein the material of the electron blocking layer can be $Al_yGa_{1-y}N$ (0.15<y<0.4). As depicted, because of the electron blocking layer 112, the lattice constant of the active layer 110 is close to the second semiconductor layer 114 and the stress between epitaxy layers is decreased. Therefore, the quality of the epitaxy layers is better and the forward voltage of the light-emitting stack is decreased.

After the second light-emitting stack 200 in FIG. 3 is formed, etching the light-emitting stack to expose a part of the first semiconductor layer 106 to form the third light-emitting stack 300 in FIG. 4. Then, a semiconductor contact layer 118 is formed on the exposed part of the first semiconductor layer 106, such that the semiconductor contact layer 118 covers at least a part of the first semiconductor layer 106. Then, respectively forming two electrode layers (not shown in the figure) on the transparent conductive oxide layer 120 and on the semiconductor contact layer 118.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light emitting device, comprising:
a first semiconductor layer;
an active layer on the first semiconductor layer;
a second semiconductor layer on the active layer, wherein the second semiconductor layer comprises a first sub-layer and a second sub-layer on the first sub-layer, wherein the second sub-layer comprises $Al_xGa_{1-x}N$ (0<x<1) and the second sub-layer comprises a surface having a structure of irregularly distributed holes, wherein a conductivity of the second semiconductor layer is p-type; and
a semiconductor contact layer on the second semiconductor layer.

2. The light emitting device of claim 1, wherein the first sub-layer comprises a first impurity concentration and the second sub-layer comprises a second impurity concentration, and
wherein the second impurity concentration is larger than the first impurity concentration.

3. The light emitting device of claim 2, wherein the second semiconductor layer comprises a third sub-layer between the first sub-layer and the second sub-layer,
wherein the third sub-layer has a same conductivity with the second sub-layer, and the third sub-layer has a third impurity concentration between the first impurity concentration and the second impurity concentration.

4. The light emitting device of claim 3, wherein a thickness of the third sub-layer is larger than that of the first sub-layer or the second sub-layer.

5. The light emitting device of claim 1, further comprising a transparent conductive oxide layer on the semiconductor contact layer and an electrode layer on the transparent conductive oxidation layer.

6. The light emitting device of claim 2, further comprising an electron blocking layer between the active layer and the second semiconductor layer, wherein a material of the electron blocking layer comprises $Al_zGa_{1-z}N$ (0.15<z<0.4) and an impurity concentration of the electron blocking layer is higher than the second impurity concentration.

7. The light emitting device of claim 1, wherein an energy bandgap of the semiconductor contact layer is lower than that of the second semiconductor layer.

8. The light emitting device of claim 1, wherein the structure of irregularly distributed holes comprises hexagonal cavities and at least one of the hexagonal cavities extends to the second semiconductor layer, and the structure is formed by an epitaxial growth process.

9. The light emitting device of claim 1, wherein the active layer emits a blue light having a main wavelength between 440~470 nm.

10. The light emitting device of claim 1, wherein the active layer emits an incoherent light.

11. A light emitting device, comprising:
a first semiconductor layer;
an active layer on the first semiconductor layer;
a second semiconductor layer on the active layer, wherein the second semiconductor layer comprises a first sub-layer and a second sub-layer on the first sub-layer, wherein the second sub-layer comprises $Al_xGa_{1-x}N$ (0<x<1) and the second sub-layer comprises a surface having a structure of irregularly distributed holes; and
a semiconductor contact layer on the second semiconductor layer, wherein the structure of irregularly distributed holes comprises hexagonal cavities.

12. The light emitting device of claim 11, wherein a conductivity of the second semiconductor layer is p-type.

13. The light emitting device of claim 11, wherein the first sub-layer comprises a first impurity concentration and the second sub-layer comprises a second impurity concentration, wherein the second impurity concentration is larger than the first impurity concentration.

14. The light emitting device of claim 13, wherein the second semiconductor layer comprises a third sub-layer between the first sub-layer and the second sub-layer, wherein the third sub-layer has a same conductivity with the second sub-layer, and the third sub-layer has a third impurity concentration between the first impurity concentration and the second impurity concentration.

15. The light emitting device of claim 14, wherein a thickness of the third sub-layer is larger than that of the first sub-layer or the second sub-layer.

16. The light emitting device of claim 13, further comprising an electron blocking layer between the active layer and the second semiconductor layer, wherein a material of the electron blocking layer comprises $Al_zGa_{1-z}N$ ($0.15<z<0.4$) and an impurity concentration of the electron blocking layer is higher than the second impurity concentration.

17. The light emitting device of claim 11, further comprising a transparent conductive oxide layer on the semiconductor contact layer and an electrode layer on the transparent conductive oxidation layer.

18. The light emitting device of claim 11, wherein at least one of the hexagonal cavities extends to the second semiconductor layer, and the structure is formed while epitaxially forming the second sub-layer.

* * * * *